(12) United States Patent
Lee et al.

(10) Patent No.: US 12,283,578 B2
(45) Date of Patent: Apr. 22, 2025

(54) SEMICONDUCTOR PACKAGE AND METHOD OF FABRICATING SAME

(71) Applicant: SAMSUNG ELECTRONICS CO., LTD., Suwon-si (KR)

(72) Inventors: Jeong Hyun Lee, Seoul (KR); Hwan Pil Park, Hwaseong-si (KR); Jong Bo Shim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 461 days.

(21) Appl. No.: 17/710,830

(22) Filed: Mar. 31, 2022

(65) Prior Publication Data
US 2022/0352130 A1 Nov. 3, 2022

(30) Foreign Application Priority Data
May 3, 2021 (KR) .................. 10-2021-0057364

(51) Int. Cl.
*H01L 25/16* (2023.01)
*H01L 21/48* (2006.01)
(Continued)

(52) U.S. Cl.
CPC ........ *H01L 25/162* (2013.01); *H01L 21/4853* (2013.01); *H01L 21/4857* (2013.01); *H01L 23/481* (2013.01); *H01L 23/49811* (2013.01); *H01L 23/49822* (2013.01); *H01L 23/49838* (2013.01); *H01L 24/16* (2013.01); *H01L 24/32* (2013.01); *H01L 24/33* (2013.01); *H01L 24/73* (2013.01); *H01L 25/165* (2013.01); *H01L 24/48* (2013.01); *H01L 2224/16227* (2013.01); *H01L 2224/16237* (2013.01); *H01L 2224/3201* (2013.01); *H01L 2224/32059* (2013.01); *H01L 2224/32145* (2013.01); *H01L 2224/32225* (2013.01); *H01L 2224/32265* (2013.01); *H01L 2224/3303* (2013.01); *H01L 2224/33051* (2013.01); *H01L 2224/33181* (2013.01); *H01L 2224/48228* (2013.01); *H01L 2224/73204* (2013.01); *H01L 2224/73253* (2013.01); *H01L 2224/73265* (2013.01);
(Continued)

(58) Field of Classification Search
CPC . H01L 25/162; H01L 25/165; H01L 21/4853; H01L 23/481; H01L 23/49811; H01L 23/49822; H01L 23/49838; H01L 24/16; H01L 24/32; H01L 24/33
See application file for complete search history.

(56) References Cited

U.S. PATENT DOCUMENTS 7,687,315 B2 3/2010 Carson
9,171,827 B2 10/2015 Lee et al.
(Continued)

*Primary Examiner* — Nathan W Ha
(74) *Attorney, Agent, or Firm* — Fish & Richardson P.C.

(57) ABSTRACT

A semiconductor package includes; a substrate including a first insulating layer and a first conductive pattern in the first insulating layer, a first semiconductor chip on the substrate, an interposer spaced apart from the first semiconductor chip in a direction perpendicular to an upper surface of the substrate and including a second insulating layer and a second conductive pattern in the second insulating layer, a first element between the first semiconductor chip and the interposer, a connection member between the substrate and the interposer, and a mold layer covering side surfaces of the first semiconductor chip and side surfaces of the first element.

18 Claims, 19 Drawing Sheets

(51) Int. Cl.
*H01L 23/00* (2006.01)
*H01L 23/48* (2006.01)
*H01L 23/498* (2006.01)

(52) U.S. Cl.
CPC ............. *H01L 2924/1431* (2013.01); *H01L 2924/1434* (2013.01); *H01L 2924/3511* (2013.01)

(56) References Cited

U.S. PATENT DOCUMENTS

| | | | |
|---|---|---|---|
| 9,324,657 | B2 | 4/2016 | Seo et al. |
| 9,935,080 | B2 | 4/2018 | Jung et al. |
| 9,955,582 | B2 | 4/2018 | Kuhlman et al. |
| 10,529,676 | B2 | 1/2020 | Bae et al. |
| 10,727,220 | B2 | 7/2020 | Kim |
| 11,227,846 | B2 * | 1/2022 | Hsu .................... H01L 23/3677 |
| 2014/0374902 | A1 * | 12/2014 | Lee ..................... H01L 23/5389 257/738 |
| 2015/0091149 | A1 * | 4/2015 | Jang ................... H01L 23/3128 257/686 |
| 2016/0276325 | A1 * | 9/2016 | Nair .................... H01L 25/162 |
| 2020/0006214 | A1 | 1/2020 | Tsai et al. |
| 2020/0243462 | A1 * | 7/2020 | Hsu .................... H01L 23/3672 |
| 2020/0243464 | A1 * | 7/2020 | Hsu .................... H01L 23/49822 |
| 2020/0402915 | A1 * | 12/2020 | Kim .................... H01L 23/5389 |
| 2020/0411461 | A1 | 12/2020 | Lee et al. |
| 2021/0005761 | A1 * | 1/2021 | Tsai .................... H01L 25/162 |
| 2021/0202392 | A1 * | 7/2021 | Kung ................... H01L 25/105 |
| 2021/0242134 | A1 * | 8/2021 | Yamanishi .......... H01L 23/3128 |
| 2022/0102297 | A1 * | 3/2022 | Hsu .................... H01Q 1/2283 |
| 2022/0285297 | A1 * | 9/2022 | Hsu .................... H01L 23/49816 |
| 2022/0392845 | A1 * | 12/2022 | Kim .................... H01L 25/18 |
| 2023/0111343 | A1 * | 4/2023 | Yim .................... H01L 24/19 257/737 |

* cited by examiner

SEMICONDUCTOR PACKAGE AND METHOD OF FABRICATING SAME

CROSS-REFERENCE TO RELATED APPLICATION

This U.S. nonprovisional application claims priority under 35 U.S.C. 119 from Korean Patent Application No. 10-2021-0057364 filed on May 3, 2021 in the Korean Intellectual Property Office, the subject matter of which is hereby incorporated by reference in its entirety.

BACKGROUND

Technical Field

The present disclosure relates generally to semiconductor packages, and more particularly, to semiconductor packages including an interposer.

Description of the Related Art

With continued developments in the electronic industry, demands for increased functionality, higher operating speeds, and further miniaturization of electronic components have increased. In response to these demands, two or more semiconductor chips may be disposed on a single package substrate using variety of methods, such as package-in-package (PIP) techniques, package-on-package (POP) techniques, etc.

Here, a POP type semiconductor package may include an interposer between an upper package and a lower package, wherein the interposer provides or facilitates various electrical connection(s) between the upper package and the lower package. In this regard, an interposer may facilitate electrical connection(s) between the upper package and the lower package while also inhibiting or preventing warpage of the upper package and/or the lower package.

SUMMARY

Embodiments of the present disclosure provide semiconductor packages exhibiting improved product reliability by disposing a passive element between an interposer and a semiconductor chip.

According to an embodiment of the present disclosure, there is provided a semiconductor package including; a substrate including a first insulating layer and a first conductive pattern in the first insulating layer, a first semiconductor chip on the substrate, an interposer spaced apart from the first semiconductor chip in a direction perpendicular to an upper surface of the substrate and including a second insulating layer and a second conductive pattern in the second insulating layer, a first element between the first semiconductor chip and the interposer, a connection member between the substrate and the interposer, and a mold layer covering side surfaces of the first semiconductor chip and side surfaces of the first element.

According to an embodiment of the present disclosure, there is provided a semiconductor package including; a first semiconductor package, and a second semiconductor package on the first semiconductor package. The first semiconductor package includes; a first substrate including a first insulating layer and a first conductive pattern in the first insulating layer, a first semiconductor chip mounted on the first substrate, a second substrate spaced apart from the first semiconductor chip in a direction perpendicular to an upper surface of the first substrate and including a second insulating layer and a second conductive pattern in the second insulating layer, and a first element between the first semiconductor chip and the second substrate. The second semiconductor package includes; a third substrate on the first semiconductor package, and a second semiconductor chip mounted on the third substrate, wherein the first element does not physically contact the second semiconductor package.

According to an embodiment of the present disclosure, there is provided a method of fabricating a semiconductor package. The method includes; providing a first substrate including a first insulating layer and a first conductive pattern, forming a passive element on one surface of the first substrate, providing a second substrate mounting a first semiconductor chip and including a second insulating layer and a second conductive pattern, forming a connection member between the first substrate and the second substrate, and forming a mold layer covering side surfaces of the connection member, covering side surfaces of the first semiconductor chip and contacting the passive element.

BRIEF DESCRIPTION OF THE DRAWINGS

Various aspects and features, as well as the making and use, of embodiments of the present disclosure will become more apparent upon consideration of the following detail description together with the accompanying drawings, in which.

DETAILED DESCRIPTION

Throughout the written description and drawings, like reference numbers and labels are used to denote like or similar elements, components, features and/or method steps. Throughout the written description certain geometric terms may be used to highlight relationships between elements, components and/or features with respect to certain embodiments. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
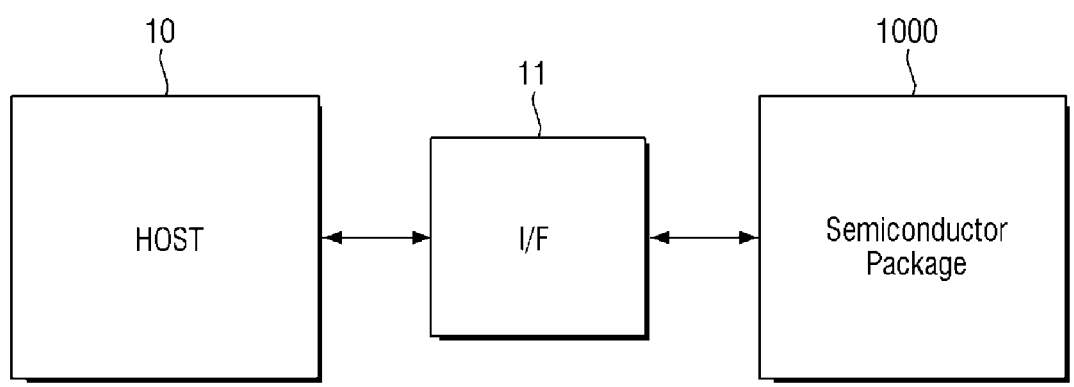
FIG. 1 is a block diagram illustrating an electronic device according to embodiments.
Figure 2:
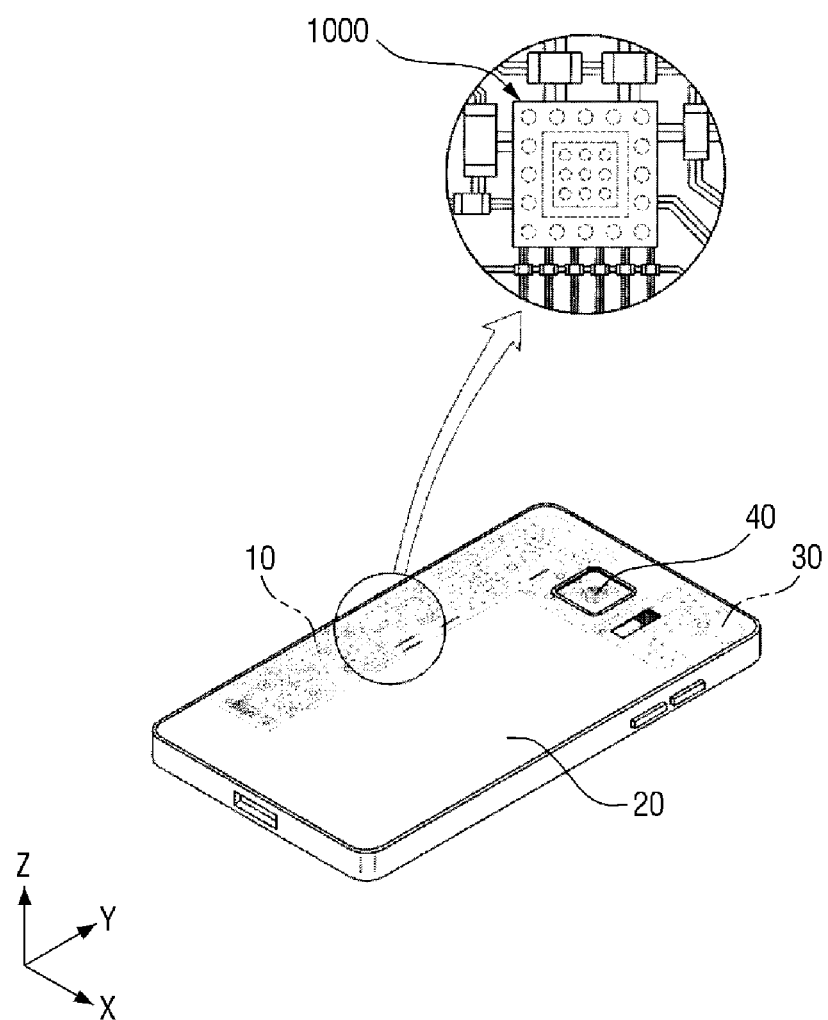
FIG. 2 is a perspective view further illustrating in one example the electronic device of FIG. 1.
Figure 3:
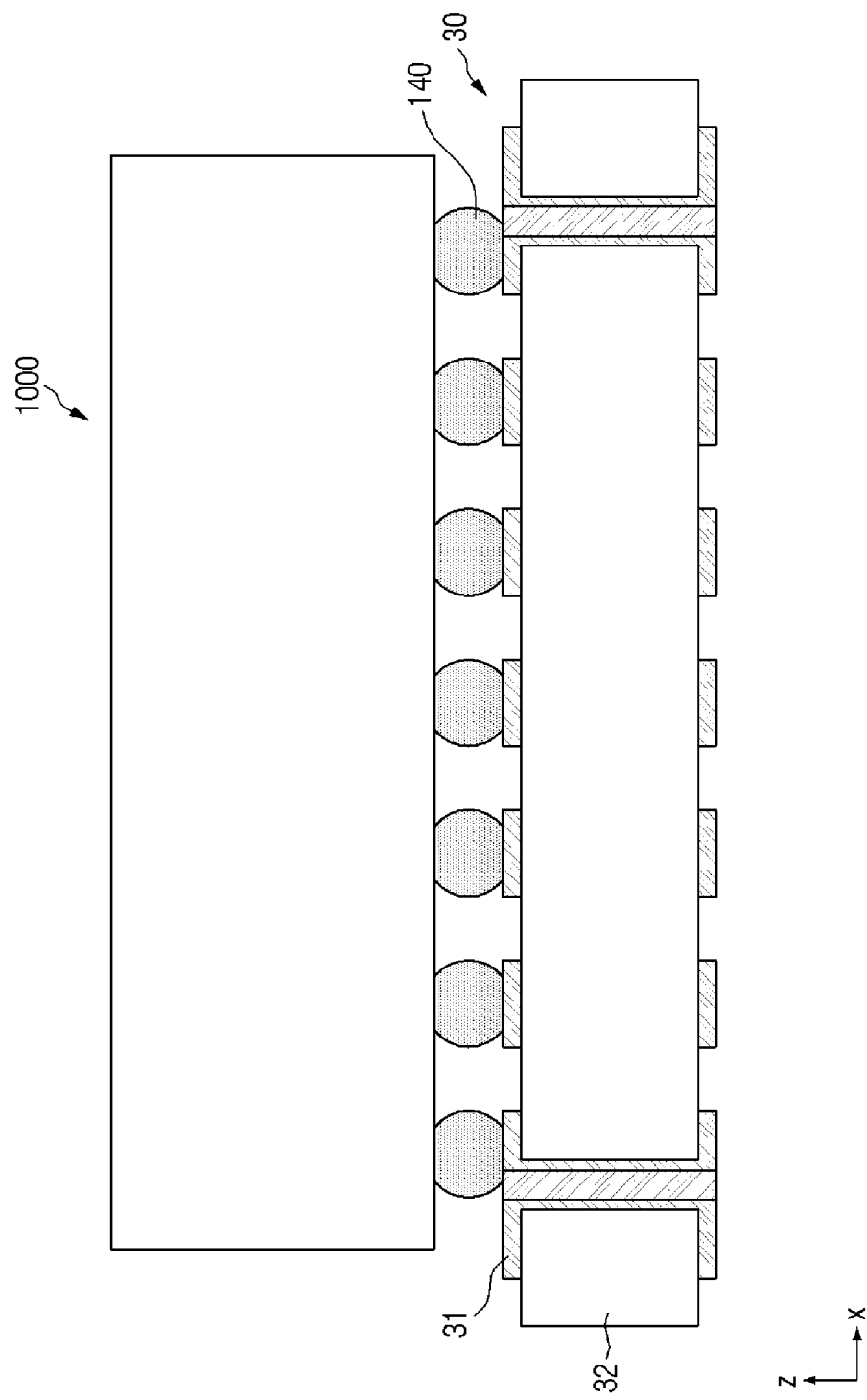
FIG. 3 is a cross-sectional view further illustrating the semiconductor package and main board of FIG. 2.
Figure 4:
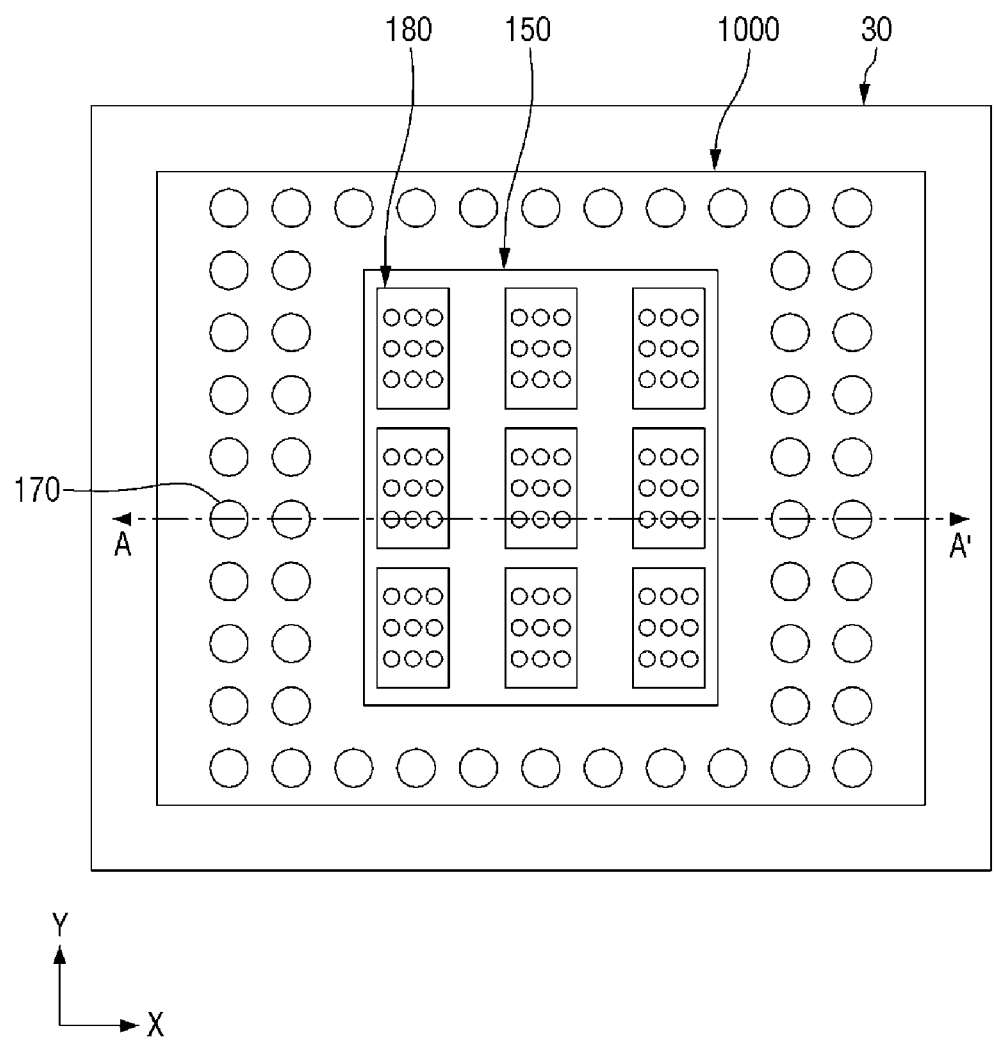
FIG. 4 is a plan (or top-down) view further illustrating the semiconductor package of FIG. 3.
Figure 5:
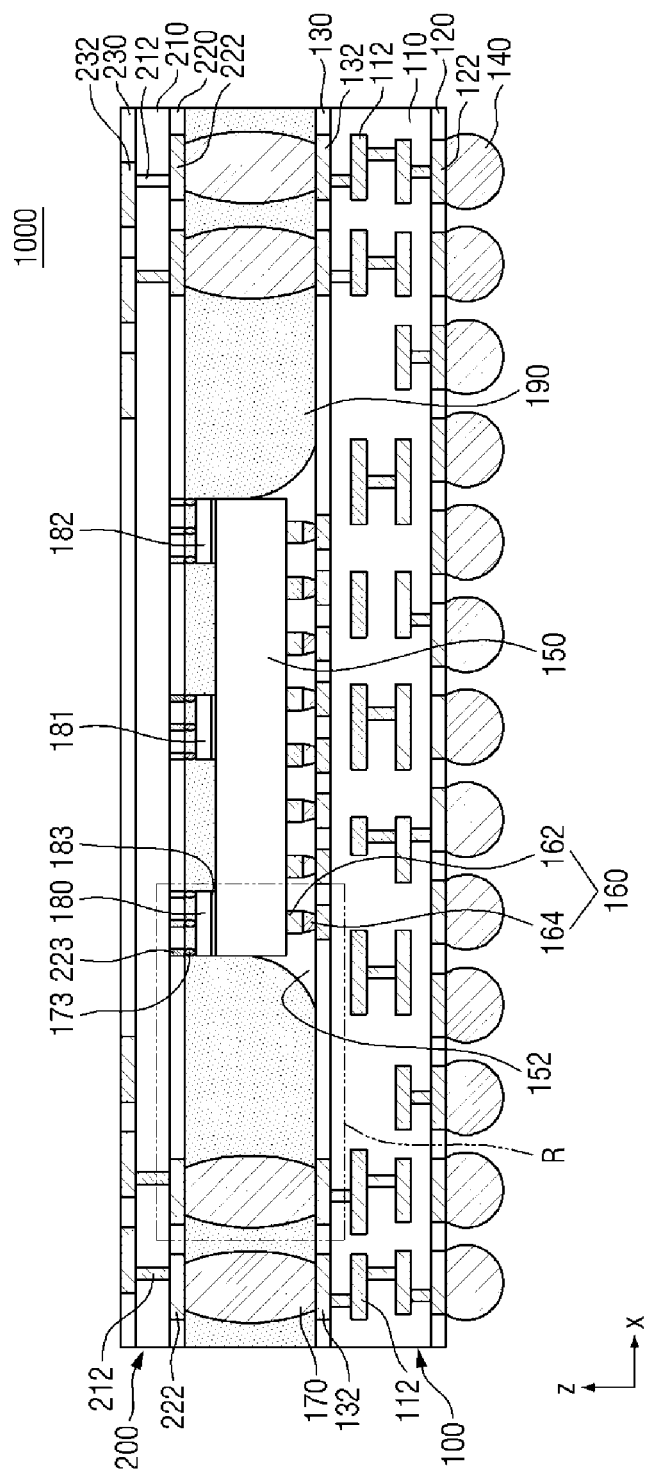
FIG. 5 is a cross-sectional view taken along line A-A' and further illustrating the semiconductor package of FIG. 4.
Figure 6:
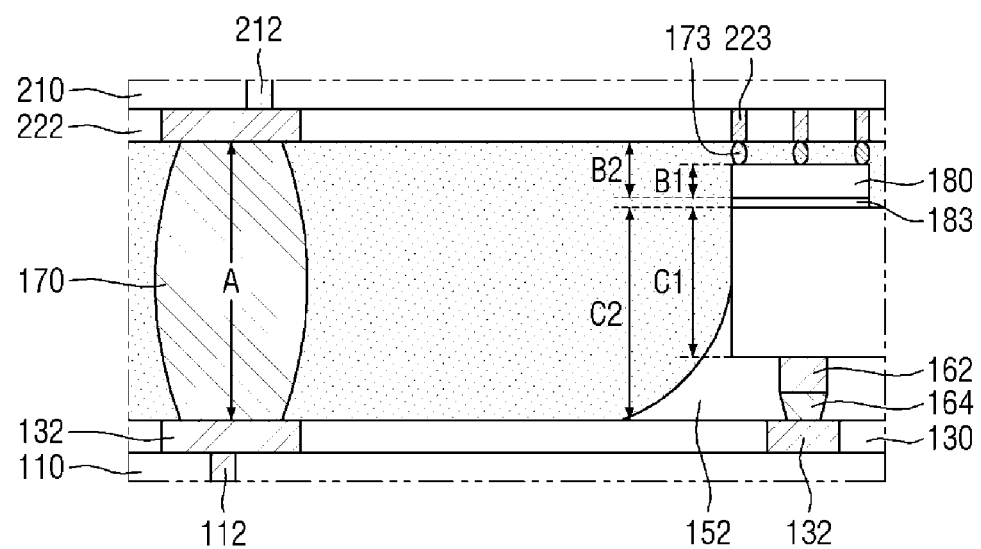
FIGS. 6 and 7 are respective, enlarged cross-sectional views further illustrating a region 'R' indicated in FIG. 5.
Figure 7:
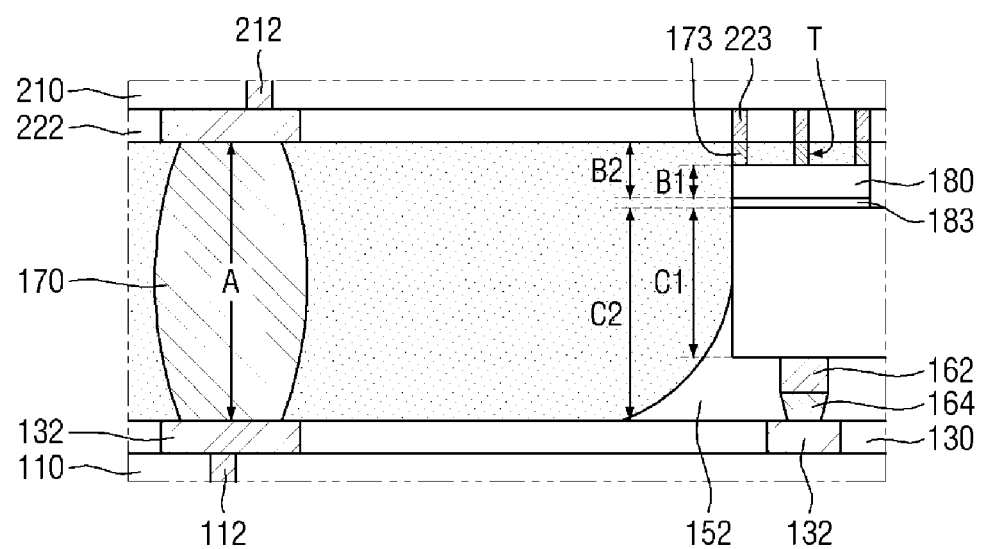

A semiconductor package 1000 according to embodiments will be described with reference to FIGS. 1, 2, 3, 3, 4, 5, 6 and 7. Here, FIGS. 1 and 2 are respective views of an electronic device 1 incorporating a first semiconductor package 1000. FIGS. 3, 4 and 5 respectively illustrate various aspects of the first semiconductor package 1000. FIGS. 6 and 7 are respective, enlarged views of region 'R' shown in FIG. 5.

Referring to FIG. 1, the electronic device 1 may include a host 10, an interface 11, and the first semiconductor package 1000.

In some embodiments, the host 10 may any type of computation or data processing device, and may be connected to the first semiconductor package 1000 through the interface 11. In this regard, the host 10 may communicate (e.g., transmit and/or receive) various signal(s) with the first semiconductor package 1000, and may generally control the operation of the first semiconductor package 1000.

In some embodiments, the host 10 may include a central processing unit (CPU), a controller, an application specific integrated circuit (ASIC), etc. The host 10 may further include one or more memory chip(s), such as a dynamic random access memory (RAM) (DRAM), a static RAM (SRAM), a phase-change RAM (PRAM), a magneto-resistive RAM (MRAM), a ferroelectric RAM (FeRAM), a resistive RAM (RRAM), etc.

Referring to FIGS. 1 and 2, the electronic device 1 may include the host 10 having a body 20 including a main board 30, a camera module 40, and the first semiconductor package 1000.

The main board 30 may be packaged (e.g., encompassed within) in the body 20 of the electronic device 1, and the host 10, the camera module 40 and the first semiconductor package 1000 may be respectively mounted (e.g., mechanically assembled and/or electrically connected) on the main board 30. Thus, the host 10, camera module 40 and first semiconductor package 1000 may be electrically interconnected via the main board 30. Further, in some embodiments, the interface 11 may be implemented by the main board 30.

The host 10 and the first semiconductor package 1000 may electrically be interconnected by the main board 30 in order to communicate various signal(s) (e.g., command signals, address signals, data signals and/or control signals).

Referring to FIG. 3, the first semiconductor package 1000 may be disposed (e.g., vertically stacked) on the main board 30. For example, first connection terminals 140 associated with the first semiconductor package 1000 may be disposed on the main board 30. That is, the main board 30 may be connected to the first semiconductor package 1000 via the first connection terminals 140.

In some embodiments, the main board 30 may be a printed circuit board (PCB), a ceramic substrate, a glass substrate, an interposer substrate, etc. Hereafter, it is assumed that the main board 30 is a PCB.

The main board 30 may include a wiring structure 31 and a core 32. The core 32 may include a copper clad laminate (CCL), a PPG, an Ajimoto Build-up Film (ABF), an epoxy, a polyimide, etc. The wiring structure 31 may include at least one of copper (Cu), aluminum (Al), silver (Ag), tin (Sn), gold (Au), nickel (Ni), lead (Pb) and/or titanium (Ti), for example.

The core 32 may be centrally disposed in the main board 30, and the wiring structure 31 may variously disposed on upper and/or lower surfaces of the core 32. Thus, exposed portions of the wiring structure 31 may be access on upper and/or lower surfaces of the main board 30.

Through-portions of the wiring structure 31 may pass through the core 32 to electrically connect points on the upper and lower surfaces. Thus, the wiring structure 31 may electrically connect different elements contacting different points on the main board 30. For example, the wiring structure 31 may electrically connect the first semiconductor package 1000 with the host 10 through one or more of the first connection terminals 140.

Referring to FIGS. 1, 2, 3, 4 and 5, the first semiconductor package 1000 may include a first substrate 100, a first semiconductor chip 150, an interposer 200, a first element 180, a first connection member 170, and a first mold layer 190, first bumps 160, a first connection wire 173, a second element 181, and an adhesive layer 183.

The first substrate 100 may be a substrate for a package. For example, the first substrate 100 may be a PCB or a ceramic substrate. Alternately, the first substrate 100 may be a wafer level package (WLP) substrate that has been fabricated at a wafer level. The first substrate 100 may include a lower surface and an opposing upper surface.

The first substrate 100 may include a first insulating layer 110, a first conductive pattern 112, a first lower passivation film 120, a first lower pad 122, a first upper passivation film 130, and a first upper pad 132.

The first insulating layer 110 and the first conductive pattern 112 in the first insulating layer 110 may constitute a wiring pattern for electrically connecting the first lower pad 122 with the first upper pad 132. Although the first insulating layer 110 is shown as a single layer for convenience of description, it may include multiple insulating layers substantially encompassing a multi-layered first conductive pattern 112. In some embodiments, the first substrate 100 may have a thickness in a range of about 90 μm to about 180 μm.

The first lower passivation film 120 and the first lower pad 122 may be formed on a lower surface of the first insulating layer 110. The first lower pad 122 may electrically be connected with the first conductive pattern 112. The first lower passivation film 120 may cover the lower surface of the first insulating layer 110, and may expose the first lower pad 122.

In some embodiments, the first connection terminals 140 may be formed on the lower surface of the first substrate 100. The first connection terminals 140 may be attached to the first lower pad 122. The first connection terminals 140 may be spherical or oval, but is not limited thereto. The first connection terminals 140 may include, but is not limited to, tin (Sn), indium (In), bismuth (Bi), antimony (Sb), copper (Cu), silver (Ag), zinc (Zn) and/or lead (Pb), for example.

The first connection terminals 140 may be used to electrically connect the first substrate 100 with one or more external device(s). Therefore, the first connection terminals 140 may variously provide electrical signal(s) to the first substrate 100 and/or provide various electrical signal(s) from the first substrate 100 to the external device(s).

The first upper passivation film 130 and the first upper pad 132 may be formed on an upper surface of the first insulating layer 110. The first upper passivation film 130 may cover the upper surface of the first insulating layer 110, and may expose the first upper pad 132.

In some embodiments, the first upper pad 132 may electrically be connected with the first lower pad 122. For example, the first upper pad 132 may contact the first conductive pattern 112.

The first lower passivation film 120 and the first upper passivation film 130 may include, but are not limited to, a photo-imageable dielectric (PID) material.

The first semiconductor chip 150 may be disposed on the first substrate 100. For example, the first semiconductor chip 150 may be mounted on the upper surface of the first substrate 100. The first semiconductor chip 150 may be an integrated circuit (IC) having hundreds to millions of semiconductor devices integrated into one chip. For example, the first semiconductor chip 150 may be a central processing unit (CPU), a graphic processing unit (GPU), a field programmable gate array (FPGA), a digital signal processor, an encryption processor, a microprocessor, a microcontroller, etc., but is not limited thereto. For example, the first semiconductor chip 150 may be a logic chip such as an analog-to-digital converter (ADC), an ASIC, and/or a memory chip such as a volatile memory (e.g., DRAM memory) and/or a nonvolatile memory (e.g., ROM memory or flash memory). Thus, in some embodiments, the first semiconductor chip 150 may include a combination of logic chip(s) and memory chip(s).

Although a single first semiconductor chip 150 is shown for convenience of illustration, those skilled in the art will appreciate that the first semiconductor package 1000 may include more than one first semiconductor chip 150. For example, a number of first semiconductor chips 150 may be laterally disposed (e.g., in the X/Y directions) across the first substrate 100.

In some embodiments, the first semiconductor chip 150 may be mounted on the first substrate 100 using a flip-chip bonding method. For example, the first bumps 160 may be formed between the upper surface of the first substrate 100 and a lower surface of the first semiconductor chip 150, such that the first bumps 160 electrically connect the first substrate 100 with the first semiconductor chip 150.

In some embodiments, the thickness of the first semiconductor chip 150 may range from about 50 μm to about 150 μm.

In some embodiments, each of the first bumps 160 may include, for example, a first pillar layer 162 and a first solder layer 164.

Here, the first pillar layer 162 may be extend (or protruded) from the lower surface of the first semiconductor chip 150, and the first pillar layer 162 may include copper (Cu), nickel (Ni), palladium (Pd), platinum (Pt), gold (Au) and/or cobalt (Co) for example.

The first solder layer 164 may connect the first pillar layer 162 with the first substrate 100. Thus, the first solder layer 164 may be connected to some of the first upper pads 132. The first solder layer 164 may be spherical or oval shape, for example. The first solder layer 164 may include tin (Sn), indium (In), bismuth (Bi), antimony (Sb), copper (Cu), silver (Ag), zinc (Zn) and/or lead (Pb), for example.

Figure 17:
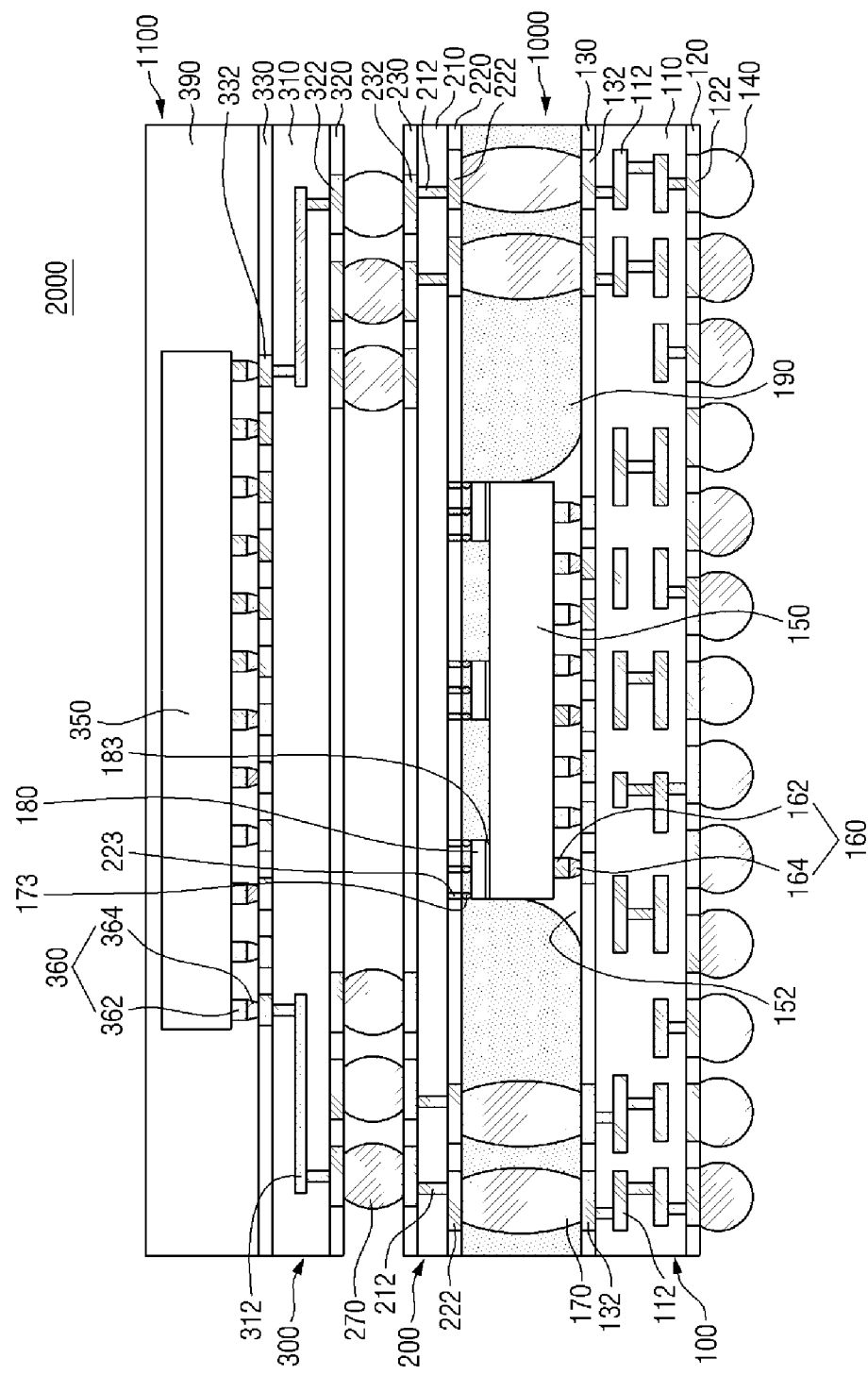
FIGS. 17, 18 and 19 are respective cross-sectional views illustrating various semiconductor packages according to embodiments.
Figure 18:
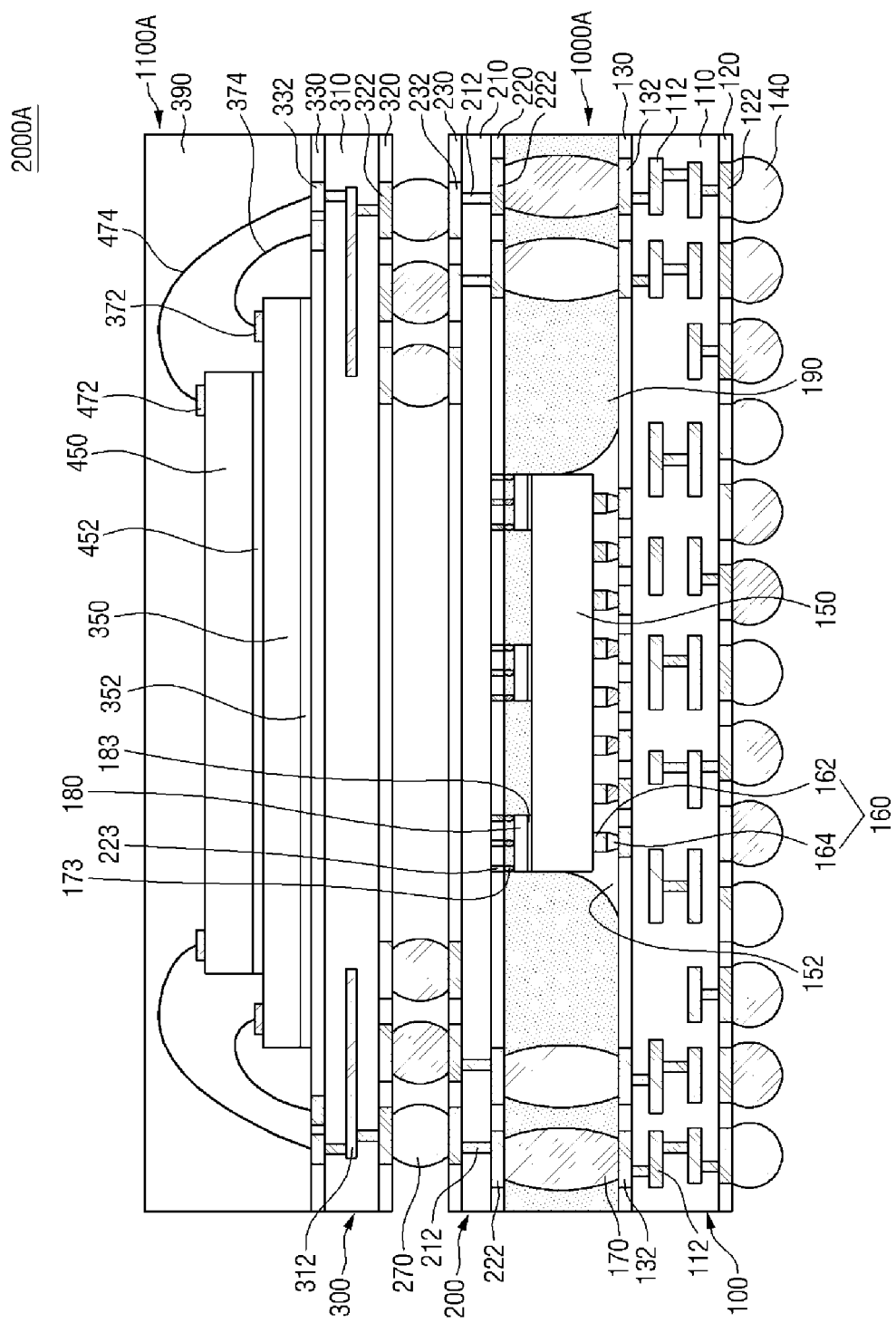

The interposer 200 may be disposed (or interposed) between the first substrate 100 and one or more overlaying substrate(s) (not shown in FIG. 5—however, see examples illustrated in FIGS. 17 and 18). For example, the interposer 200 may be disposed between the upper surface of the first substrate 100 and a lower surface of an overlaying substrate. In some embodiments, the interposer 200 may be disposed on an upper surface of the first semiconductor chip 150. In some embodiments, the interposer 200 may refer to as a second substrate 200. The interposer 200 may facilitate various interconnection(s) between the first substrate 100 and the overlaying substrate. In addition, the interposer 200 may inhibit or prevent warpage of the first substrate 100 and/or the overlaying substrate.

Thus, the interposer 200 may include a lower surface and an opposing upper surface, wherein the lower surface of the interposer 200 faces the upper surface of the first substrate 100 and the upper surface of the interposer 200 faces a lower surface of the overlaying substrate.

The interposer 200 may be vertically spaced apart from the first substrate 100. Further, the interposer 200 may be vertically spaced apart from the first semiconductor chip 150.

The interposer 200 may include a second insulating layer 210, a second conductive pattern 212, a second lower passivation film 220, a second lower pad 222, a second upper passivation film 230, and a second upper pad 232.

The second insulating layer 210 and the second conductive pattern 212 in the second insulating layer 210 may constitute a wiring pattern for electrically connecting the second lower pad 222 with the second upper pad 232. Although the second insulating layer 210 is shown as a single layer for convenience of illustration, those skilled in the art will appreciate that the second insulating layer 210 may include multiple layers substantially encompassing a multi-layered second conductive pattern 212.

The second lower passivation film 220 and the second lower pad 222 may be formed on the lower surface of the second insulating layer 210. The second lower passivation film 220 may cover the lower surface of the second insulating layer 210, and may exposes the second lower pad 222.

In some embodiments, the second lower pad 222 may electrically be connected with the second upper pad 232. For example, the second lower pad 222 may contact the second conductive pattern 212.

The second upper passivation film 230 and the second upper pad 232 may be formed on an upper surface of the second insulating layer 210. The second upper pad 232 may electrically be connected with the second conductive pattern 212. The second upper passivation film 230 may cover the upper surface of the second insulating layer 210, and may expose the second upper pad 232.

The second lower passivation film 220 and the second upper passivation film 230 may include, but are not limited to, a photo-imageable dielectric (PID) material.

Referring to FIG. 6, the first connection wire 173 may be disposed between an upper surface of the first element 180 and the interposer 200. The first connection pad 223 is disposed in the interposer 200 in contact with the first connection wire 173. In some embodiments, the first connection wire 173 may be formed of solder.

Alternately, referring to FIG. 7, the first connection wire 173 may be formed by filling a trench T formed in a vertical direction (e.g., the Z direction) perpendicular to the upper surface of the first substrate 100. Here, the first connection wire 173 may be formed by forming a liner along a bottom surface of the trench T, and then filling the liner with a conductive material, such as copper (Cu).

The first element 180 may be interposed between the upper surface of the first semiconductor chip 150 and the upper surface of the interposer 200. In some embodiments, the first element 180 may be a power source (or a power connection) providing power to another semiconductor chip (not shown in FIGS. 5, 6 and 7—however, see examples illustrated in FIGS. 17 and 18) disposed on the overlaying substrate. Thus, the first element 180 may connect power from the main board 30 mounting the first semiconductor chip 150 to the first connection wire 173 and the first connection pad 223. As the first element 180 is disposed between the first semiconductor chip 150 and the interposer 200, the first element 180 may serve to structurally support the first semiconductor package 1000. In this regard, as the first element 180 is disposed with the first mold layer 190 of the first semiconductor package 1000, spacing interval(s) between the first connection terminals 140 may be reduced, thereby improving overall product reliability for the first semiconductor package 1000.

In some embodiments, the first element 180 and the second element 181 may be passive elements, wherein the second element 181 is laterally spaced apart (e.g., in a horizontal direction (e.g., the X direction or the Y direction) parallel to the upper surface of the first substrate 100) from the first element 180. Additionally, a third element 182 may be laterally spaced apart from both the first element 180 and the second element 181 in a horizontal direction. Thus, the first semiconductor package 1000 may include a plurality of passive elements disposed between the upper surface of the first semiconductor chip 100 and the lower surface of the interposer 200.

In this regard, a thickness for one or more of the first element 180, the second element 181 and the third element 182 may range from about 20 μm to about 150 μm.

Further, the adhesive layer 183 is respectively disposed between a lower surface of one or more of the first element 180, the second element and the third element and the upper surface of the first semiconductor chip 150. Here, the adhesive layer 183 may include one or more non-conductive materials (e.g., one or more of resin(s) and/or an epoxy) capable of fixing the first element 180, the second element 181 and/or the third element 182 to the upper surface of the first semiconductor chip 150.

The first connection member 170 may be disposed between the upper surface of the first substrate 100 and the lower surface of the interposer 200. Thus, the first connection member 170 may be used to electrically connect the first substrate 100 and the interposer 200. For example, the first connection member 170 may contact the first upper pad 132 of the first substrate 100 and the second lower pad 222 of the interposer 200. In this manner, the first connection member 170 may electrically connect the first conductive pattern 112 with the second conductive pattern 212.

A "height" 'A' (e.g., measured in the vertical direction) of the first connection member 170 may be substantially the same as a distance between the upper surface of the first substrate 100 and the lower surface of the interposer 200. In this case, the height 'A' may represent a maximum distance (e.g., measured in the vertical direction) between the upper surface of the first substrate 100 and the lower surface of the interposer 200.

Referring to FIG. 6, the height 'A' of the first connection member 170 may be greater than a sum of a height 'B1' of the first element 180 (the second element 181 and/or the third element 182), a vertical thickness of the adhesive layer 183, and a height 'C1' of the first semiconductor chip 150.

Referring to FIG. 7, the height 'A' of the first connection member 170 may also be greater than a sum of a height 'C2' and a height 'B2', wherein the height C2 is equal to the height 'C1' of the first semiconductor chip 150 and a vertical thickness of the first bumps 160 and the height 'B2' is equal to a height 'B1' of the first element 180 (the second element 181 and/or the third element 182) and a height of the first connection wire 173.

The first connection member 170 may have a spherical or an oval cross-section, for example. The first connection member 170 may include tin (Sn), indium (In), bismuth (Bi), antimony (Sb), copper (Cu), silver (Ag), zinc (Zn) and/or lead (Pb), for example.

In some embodiments, the first mold layer 190 may be formed on the first substrate 100. The first mold layer 190 may fill a region between the first substrate 100 and the interposer 200. Therefore, the first mold layer 190 may cover and physically protect at least part of the first substrate 100, as well as the first semiconductor chip 150, the first bumps 160, and the first connection member 170. The first connection member 170 may electrically connect the first substrate 100 with the interposer 200 by passing through a portion of the first mold layer 190. That is, the first mold layer 190 may cover at least part of side surfaces of the first semiconductor chip 150, and at least part of the side surfaces of the first element 180.

The first mold layer 190 may include an insulating polymer material, such as an epoxy molding compound (EMC), for example.

In some embodiments, a first underfill material 152 may be formed on the upper surface of the first substrate 100 to fill region(s) between the lower surface of the first substrate 100 and the upper surface of the first semiconductor chip 150. In this manner, the first underfill material 152 may prevent the first semiconductor chip 150 from being mechanically damaged by securing the first semiconductor chip 150 to the first substrate 100. Thus, the first underfill material 152 may substantially surround the first bumps 160 electrically connecting the first substrate 100 with the first semiconductor chip 150 through the first underfill material 152.

The first underfill material 152 may include one or more insulating polymer material(s) such as EMC, for example. In some embodiments, the first underfill material 152 may include at least one material different from that of the first mold layer 190. For example, the first underfill material 152 may include at least one insulating material having a greater fluidity than any of the insulating material(s) of the first mold layer 190. Therefore, the first underfill material 152 may efficiently migrate (or flow) into narrow space(s) between the first substrate 100 and the first semiconductor chip 150.

FIGS. 9, 10, 11 and 12 are related cross-sectional views illustrating steps of a method of fabricating the semiconductor package of FIG. 5.

Figure 9:
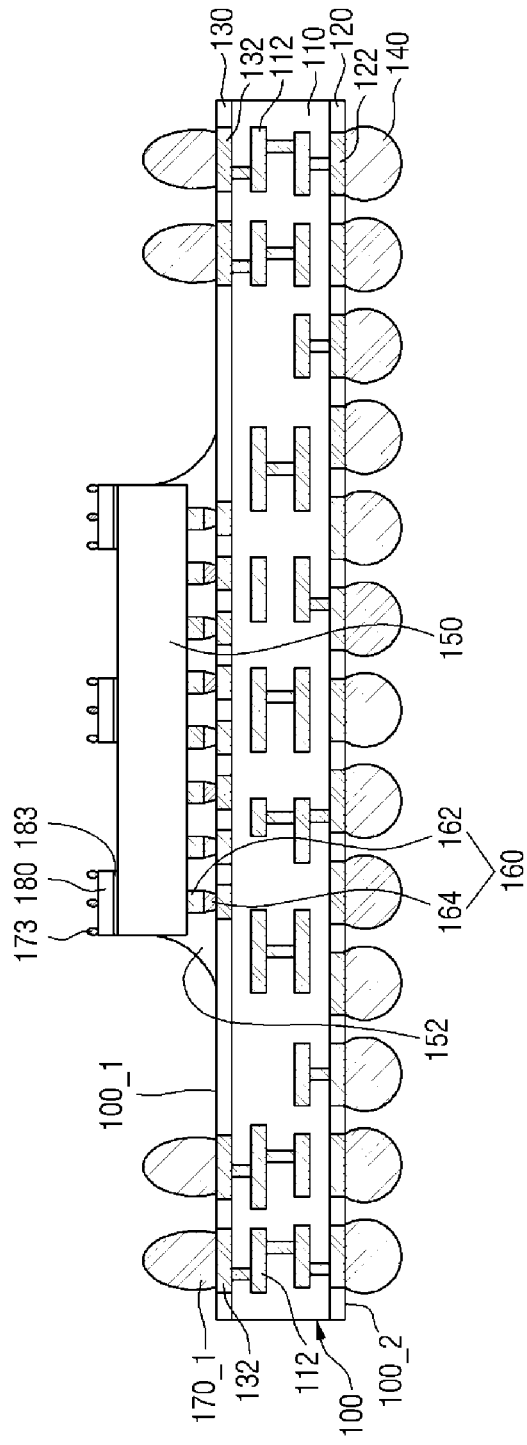
FIGS. 9, 10, 11 and 12 are related cross-sectional views illustrating steps of a method of fabricating the semiconductor package of FIG. 5.

Referring to FIG. 9, the first element 180 may be formed on the first semiconductor chip 150 such that the first semiconductor chip 150 may be mounted on the first substrate 100. That is, the first semiconductor chip 150 and a first pre connection member 170_1 may be disposed on the upper surface 100_1 of the first substrate 100.

Here, for example the first element 180 may be attached to the first semiconductor chip 150 using the adhesive layer 183, a die attach film, or some other non-conductive material(s).

Once the first element 180 is attached to the first semiconductor chip 150, the first connection wire 173 may be formed on the upper surface of the first element 180.

Figure 10:
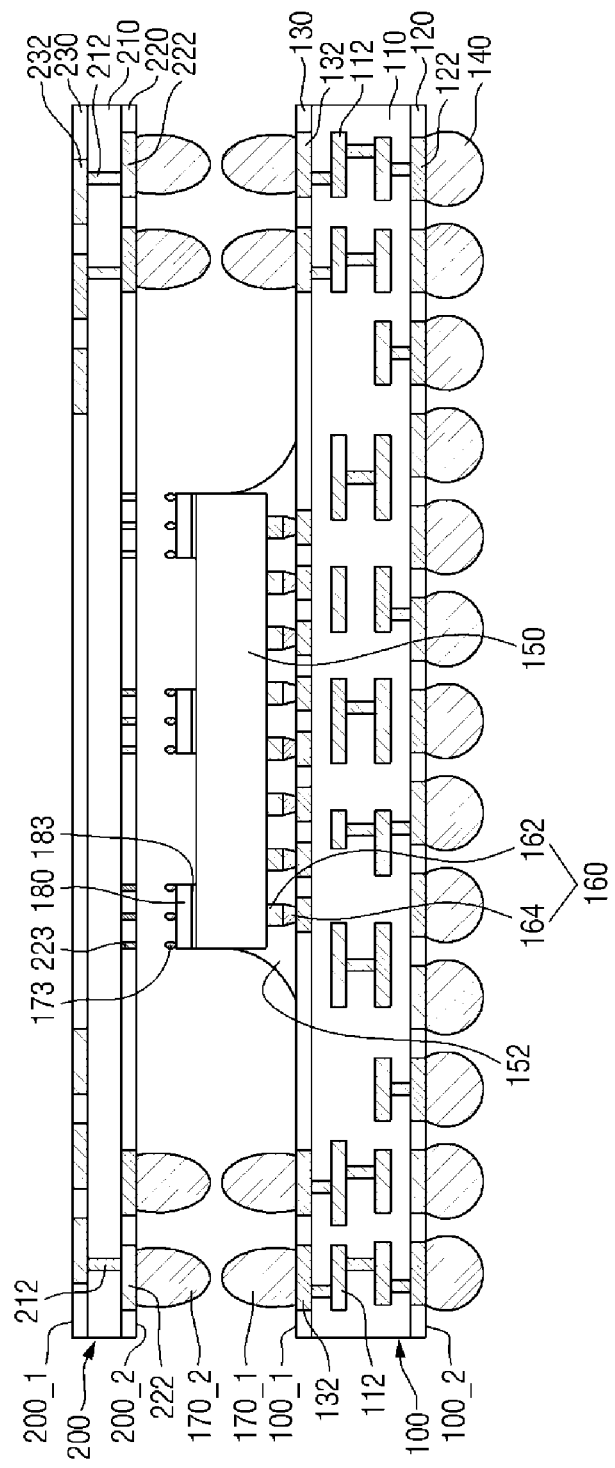

Referring to FIG. 10, the interposer 200 may now be disposed on the first substrate 100. For example, a second pre connection member 170_2 may be disposed on the lower surface 200_2 of the interposer 200, such that when the interposer 200 is disposed on the first substrate 100, the lower surface 200_2 of the interposer 200 faces the upper surface 100_1 of the first substrate 100.

The disposal of the interposer 200 on the first substrate 100 may be performed using a thermal compression (TC)

bonding method that applies heat while applying force to the upper surface of the interposer 200 using a bonding tool, for example.

Figure 11:
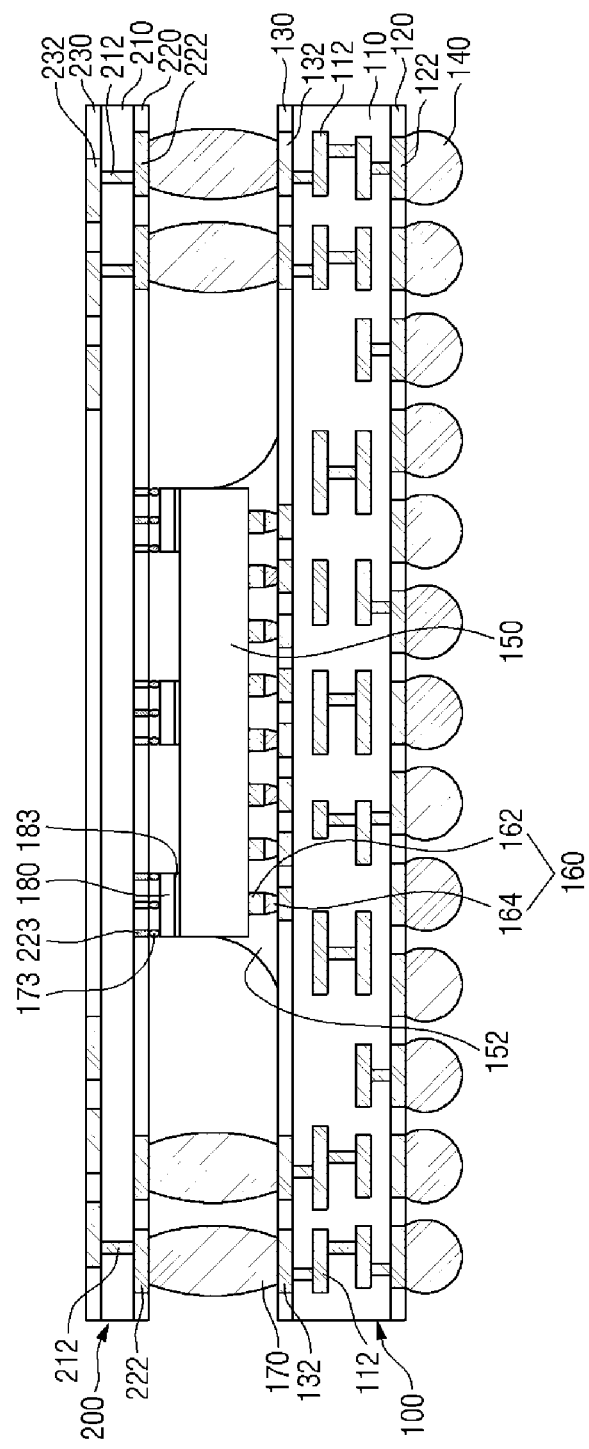

Referring to FIG. 11, the first pre connection member 170_1 associated with the first substrate 100 and the second pre connection member 170_2 associated with the interposer 200 may be merged (or connected) to form the first connection member 170. In some embodiments, the first connection member 170 and its constituent components may be formed from solder.

The first connection pad 223 on the lower surface of the interposer 200 may be electrically connected with the first connection wire 173 once the interposer 200 is disposed on the first substrate 100.

Figure 12:
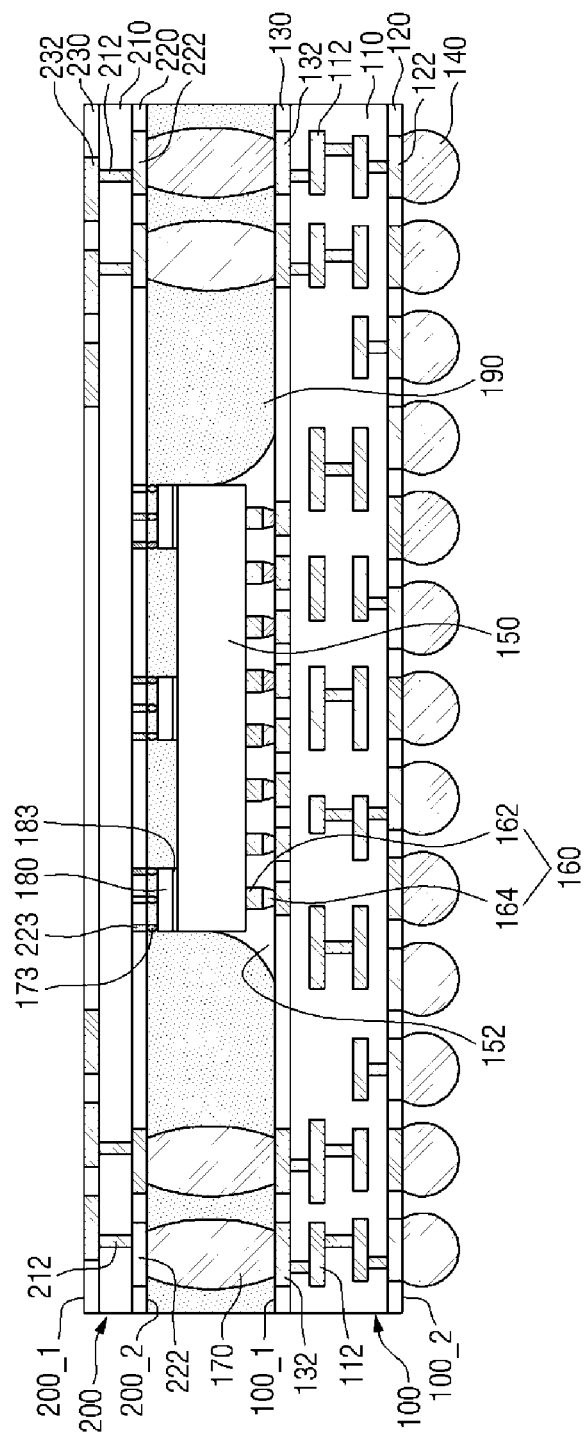

Referring to FIG. 12, the first mold layer 190 is formed to at least substantially cover side surfaces of the first semiconductor chip 150, the first connection member 170, and the first element 180. Thus, the first mold layer 190 may be formed between the upper surface 100_1 of the first substrate 100 and on the lower surface 200_2 of the interposer 200. The first mold layer 190 may also be formed between the first connection wires 173. That is, as the first element 180 may be disposed within the first mold layer 190 to further support the structure of the semiconductor package 1000.

Figure 8:
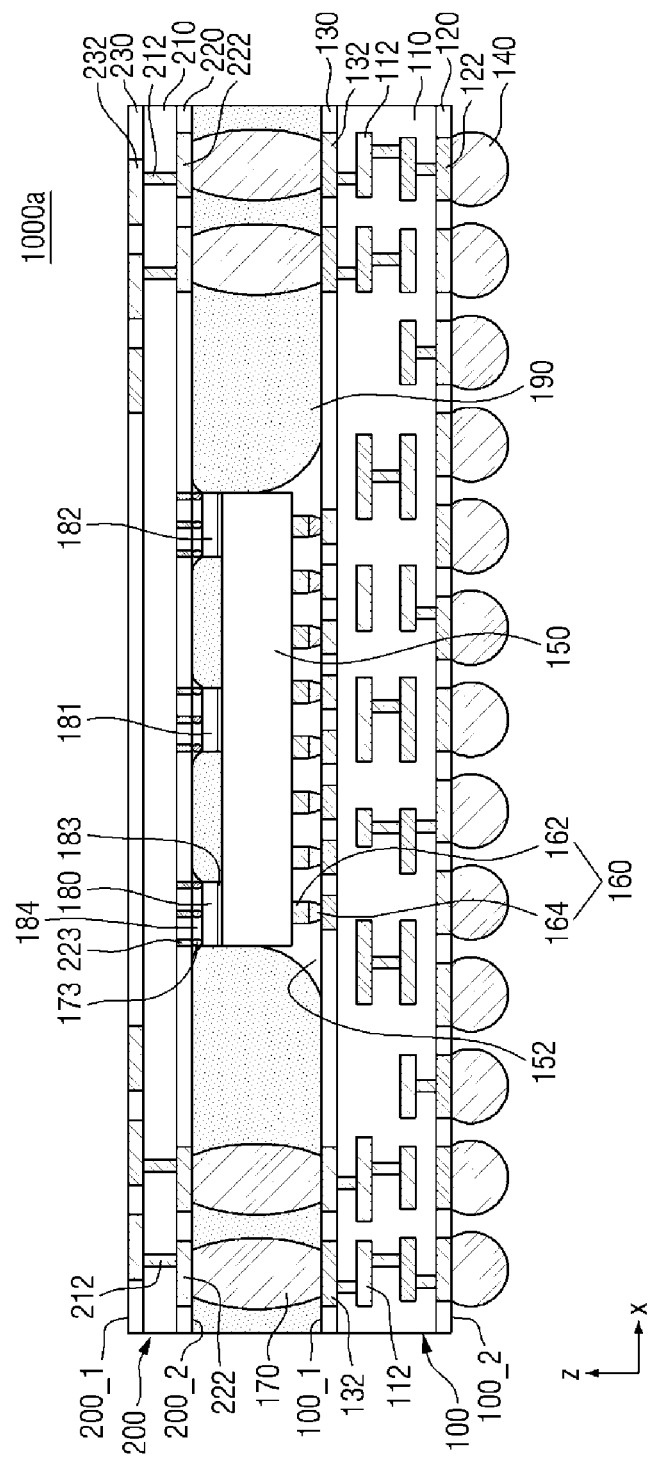
FIG. 8 is a cross-sectional view illustrating a semiconductor package according to embodiments.

FIG. 8 is a cross-sectional view illustrating a semiconductor package 1000a according to embodiments. Hereafter, only material differences between FIGS. 7 and 8 will be highlighted.

Referring to FIG. 8, a second underfill material 184 may be introduced between the lower surface 200_2 of the interposer 200 and an upper surface of the first element 180. Here, the second underfill material 184 may flow into spaces between the first connection wires 173. Accordingly, adhesion between the first element 180 and the interposer 200 may be enhanced by the second underfill material 184.

The second underfill material 184 may include one or more insulating polymer material(s) such as EMC, for example. In some embodiments, the second underfill material 184 may include at least one material different from the material (s) of the first mold layer 190. In some embodiments, the second underfill material 184 may include one or more filler(s) including particles with diameter(s) less than the diameter(s) of particles in the first mold layer 190.

FIGS. 13, 14, 15 and 16 are related cross-sectional views illustrating steps of a method of fabricating the semiconductor package of FIG. 8.

Figure 13:
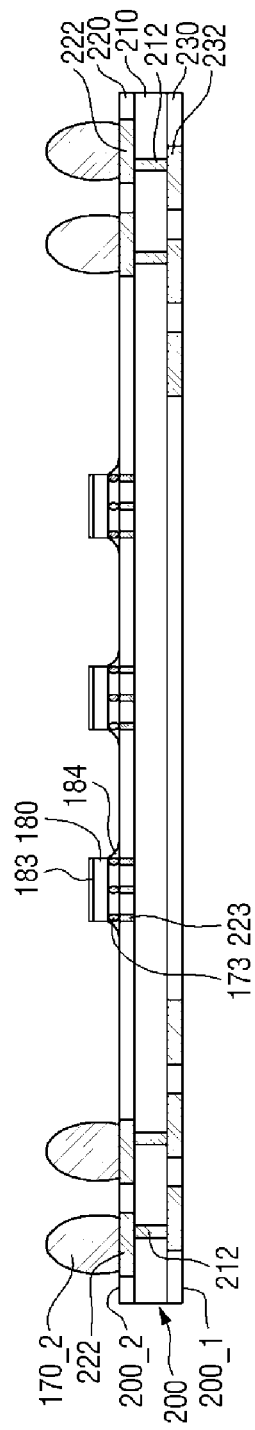
FIGS. 13, 14, 15 and 16 are related cross-sectional views illustrating steps of a method of fabricating the semiconductor package of FIG. 8.

Referring to FIG. 13, the interposer 200 including the second insulating layer 210 and the second conductive pattern 212 is formed. The first element 180 and the second pre connection member 170_2 may be disposed on the lower surface 200_2 of the interposer 200. (Of note, the interposer 200 of FIG. 13 is shown upside-down in relation to the previously (and arbitrarily) assumed geometric perspective of preceding drawings).

The first connection pad 223 is formed in the interposer 200, and the first element 180 is formed on the lower surface 200_2 of the interposer 200 in relation to the first connection wire 173.

After the first element 180 is formed on the lower surface 200_2 of the interposer 200, the second underfill material 184 may be introduced between the lower surface 200_2 of the interposer 200 and the first element 180. In this regard, the second underfill material 184 may also be introduced between the first connection wires 173. Accordingly, adhesion between the first element 180 and the interposer 200 may be enhanced by the introduction of the second underfill material 184.

Figure 14:
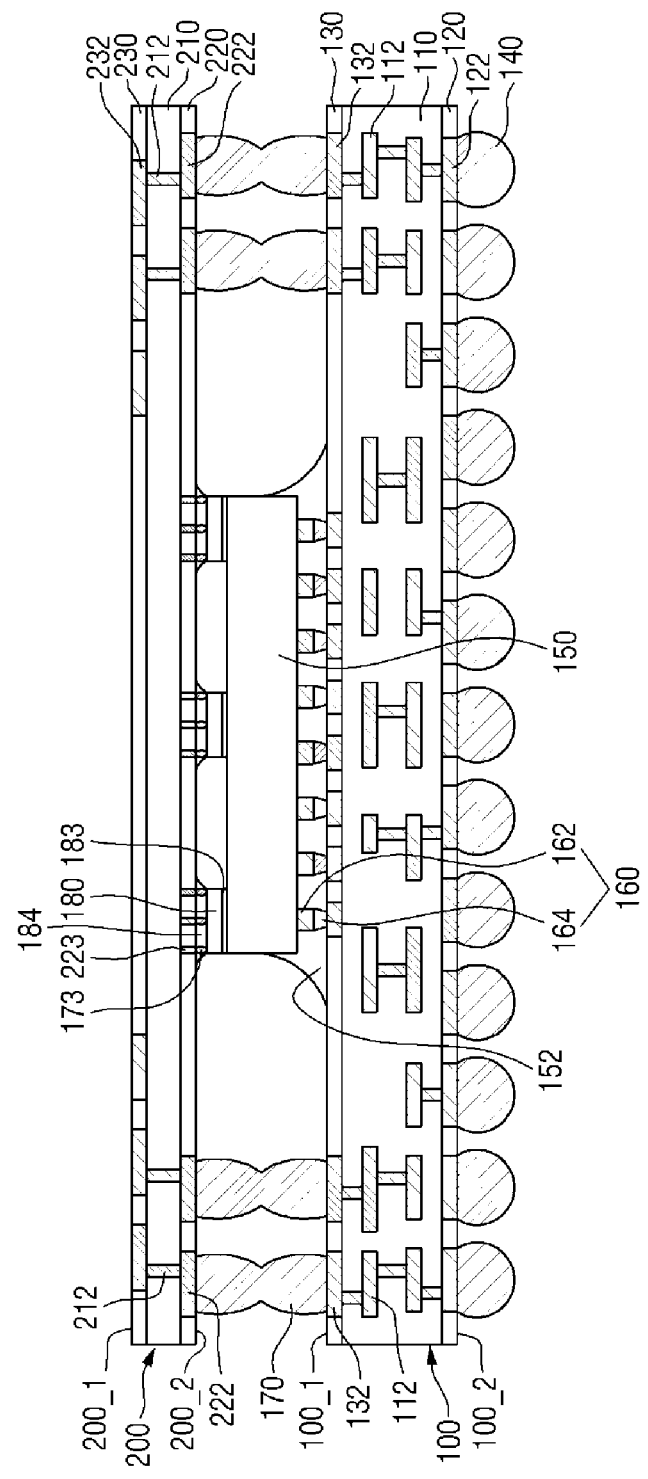
Figure 15:
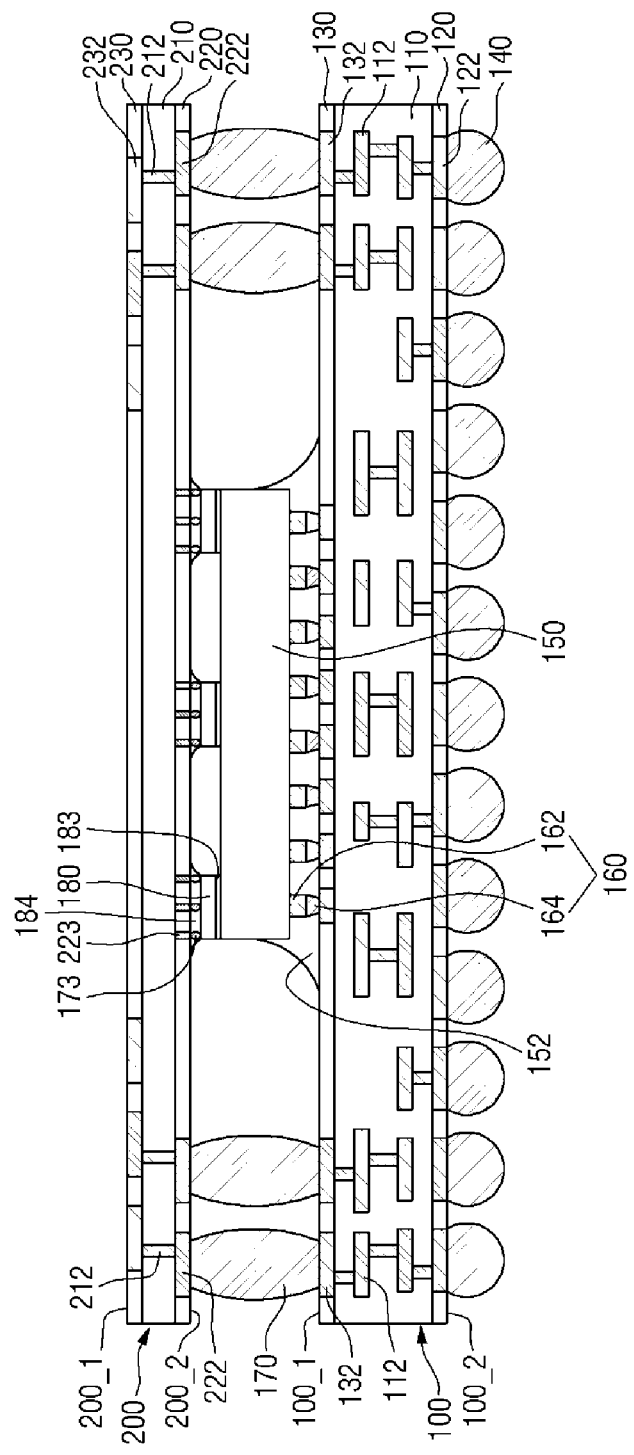

Referring to FIGS. 14 and 15, the first substrate 100 including the first insulating layer 110 and the first conductive pattern 112, as well as the first semiconductor chip 150 may be disposed on the upper surface 100_1 of the first substrate 100.

Once the interposer 200 of FIG. 13 is flipped, the upper surface 100_1 of the first substrate 100 and the lower surface 200_2 of the interposer 200 will face each other. Here, the lower surface of the first element 180 may be attached to the upper surface of the first semiconductor chip 150 using the adhesive layer 183. And as previously noted and as emphasized in relation to FIGS. 14 and 15, the first substrate 100 and the interposer 200 may be electrically connected by the formation of the first connection member 170.

Figure 16:
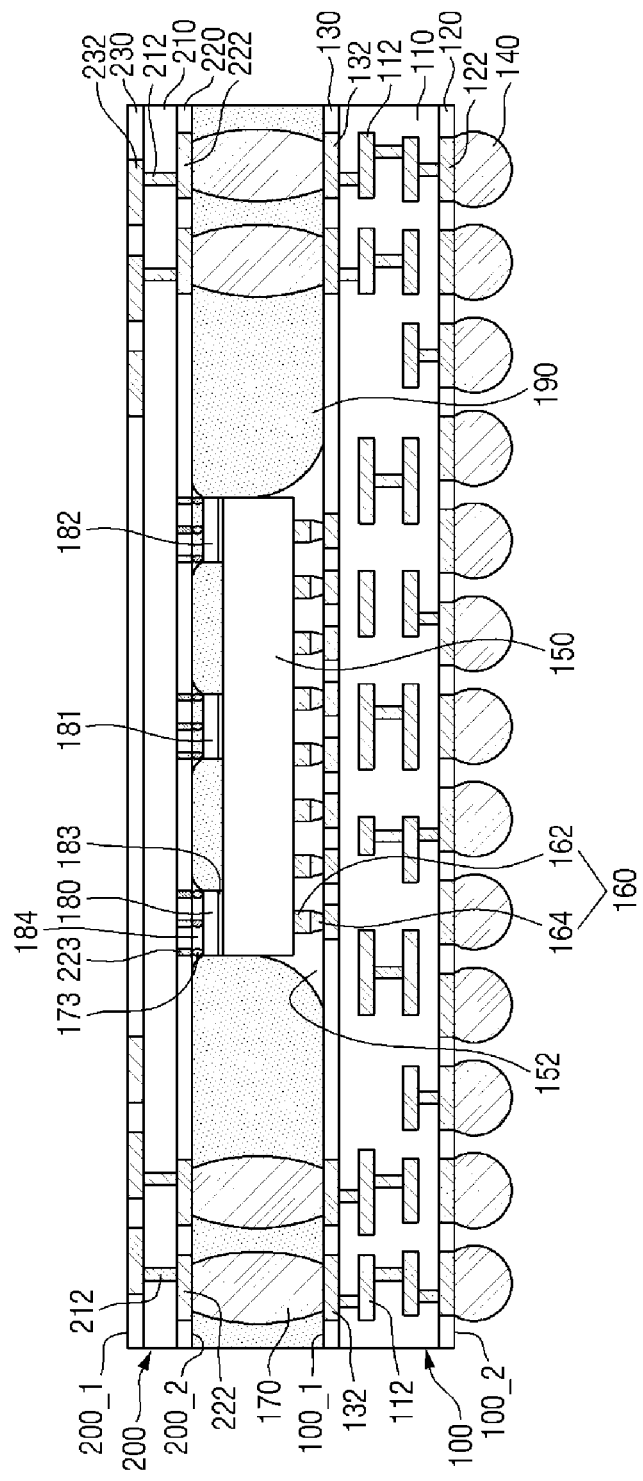

Referring to FIG. 16, the first mold layer 190 may now be introduced to cover (e.g., substantially surround) the first connection member 170, as well side surfaces of the first semiconductor chip 150 and the first element 180.

FIG. 17 is a cross-sectional view illustrating a semiconductor package 2000 according to embodiments. Hereafter, only material differences between the embodiment of FIG. 17 and previously described embodiments will be emphasized.

Referring to FIG. 17, a second semiconductor package 1100 including a second semiconductor chip 350 may be mounted on a third substrate 300 (e.g., one example of an overlaying substrate). The second semiconductor package 1100 may then be disposed on the first semiconductor package 1000.

The third substrate 300 may be disposed on the upper surface of the interposer 200. In some embodiments, the third substrate 300 may be a package substrate, such as a PCB, a ceramic substrate, etc. Alternately, the third substrate 300 may be a wafer level substrate (e.g., a wafer level package (WLP) fabricated to a wafer level). The third substrate 300 may include a lower surface and an opposing upper surface.

The third substrate 300 may include a third insulating layer 310, a third lower passivation film 320, a third lower pad 322, a third upper passivation film 330, and a third upper pad 332.

The third insulating layer 310 and the third conductive pattern 312 in the third insulating layer 310 may constitute a wiring pattern capable of electrically connecting the third lower pad 322 to the third upper pad 332. Although the third insulating layer 310 is shown as a single layer, those skilled in the art will appreciate that the third insulating layer 310 may include multiple layers substantially encompassing various elements of a multi-layered third conductive pattern 312.

The third lower passivation film 320 and the third lower pad 322 may be formed on a lower surface of the third insulating layer 310. The third lower passivation film 320 may cover the lower surface of the third insulating layer 310, and may expose the third lower pad 322.

The third upper passivation film 330 and the third upper pad 332 may be formed on an upper surface of the third insulating layer 310. The third upper passivation film 330 may cover the upper surface of the third insulating layer 310, and may expose the third upper pad 332.

The third lower passivation film 320 and the third upper passivation film 330 may include, but are not limited to, a photo-imageable dielectric (PID) material.

A second connection member 270 may be interposed between the interposer 200 and the third substrate 300. The second connection member 270 may contact the upper surface of the interposer 200 and the lower surface of the third substrate 300. The second connection member 270 may electrically connect the interposer 200 with the third substrate 300. For example, the second connection member 270 may contact the second upper pad 232 of the interposer 200 and the third lower pad 322 of the third substrate 300.

The second connection member 270 may have a spherical or an oval cross-section, but is not limited thereto. The second connection member 270 may include tin (Sn), indium (In), bismuth (Bi), antimony (Sb), copper (Cu), silver (Ag), zinc (Zn) and/or lead (Pb), for example.

The second semiconductor chip 350 may be mounted on the third substrate 300. Here, the second semiconductor chip 350 may be an integrated circuit (IC), such as a logic chip (e.g. a processor) and/or a memory chip including volatile memory and/or nonvolatile memory.

Although only a single second semiconductor chip 350 is illustrated in FIG. 17 for convenience of description, those skilled in the art will appreciate that multiple second semiconductor chips 350 may be disposed on the third substrate 300.

In some embodiments, the second semiconductor chip 350 may be mounted on the third substrate 300 using a flip chip bonding method. For example, second bumps 360 may be formed between the upper surface of the third substrate 300 and the lower surface of the second semiconductor chip 350. The second bumps 360 may be variously and electrically connected with (and through) the third substrate 300 in order to electrically connect the second semiconductor chip 350.

Each of the second bumps 360 may include, for example, a second pillar layer 362 and a second solder layer 364. Here, the second pillar layer 362 and the second solder layer 364 may be substantially similar to the first pillar layer 162 and the first solder layer 164 previously described.

In some embodiments, a second mold layer 390 may be formed on the third substrate 300 to at least partially cover and thereby protect the third substrate 300, the second semiconductor chip 350, and the second bumps 360. The second mold layer 390 may include an insulating polymer material, such as EMC, for example.

In the foregoing configuration, the first element 180 does not physically contact the second semiconductor package 1100. That is, as previously described, after the first element 180 is formed on the first semiconductor package 1000, the second semiconductor package 1100 is disposed on the first semiconductor package 1000.

FIG. 18 is a cross-sectional view illustrating a semiconductor package 2000A according to embodiments. Only material difference between the embodiment of FIG. 18 and previously described embodiments will be emphasized.

Referring to FIG. 18, the second semiconductor chip 350 is mounted on the third substrate 300 by a method other than a flip chip bonding method.

For example, the second semiconductor chip 350 may be mounted on the third substrate 300 using a first adhesive layer 352. That is, the first adhesive layer 352 may attach the lower surface of the second semiconductor chip 350 to the upper surface of the third substrate 300. The first adhesive layer 352 may include at least one of a liquid epoxy, an adhesive tape, a conductive medium, etc.

In some embodiments, the second semiconductor chip 350 may electrically be connected with the third substrate 300 through first bonding wires 374. For example, the first bonding wires 374 may variously connect a first chip pad 372 of the second semiconductor chip 350 to the third upper pad 332 of the third substrate 300.

In some embodiments, multiple semiconductor chips may be disposed (e.g., vertically stacked) on the third substrate 300. In FIG. 18, a third semiconductor chip 450 is shown stacked on the second semiconductor chip 350, as an example.

In some embodiments, the third semiconductor chip 450 may be disposed on the second semiconductor chip 350 using a second adhesive layer 452. That is, the second adhesive layer 452 may attach a lower surface of the third semiconductor chip 450 to an upper surface of the second semiconductor chip 350.

In some embodiments, the third semiconductor chip 450 may electrically be connected with the third substrate 300 by second bonding wires 474. For example, the second bonding wires 474 may connect a second chip pad 472 of the third semiconductor chip 450 to the third upper pad 332 of the third substrate 300.

Figure 19:
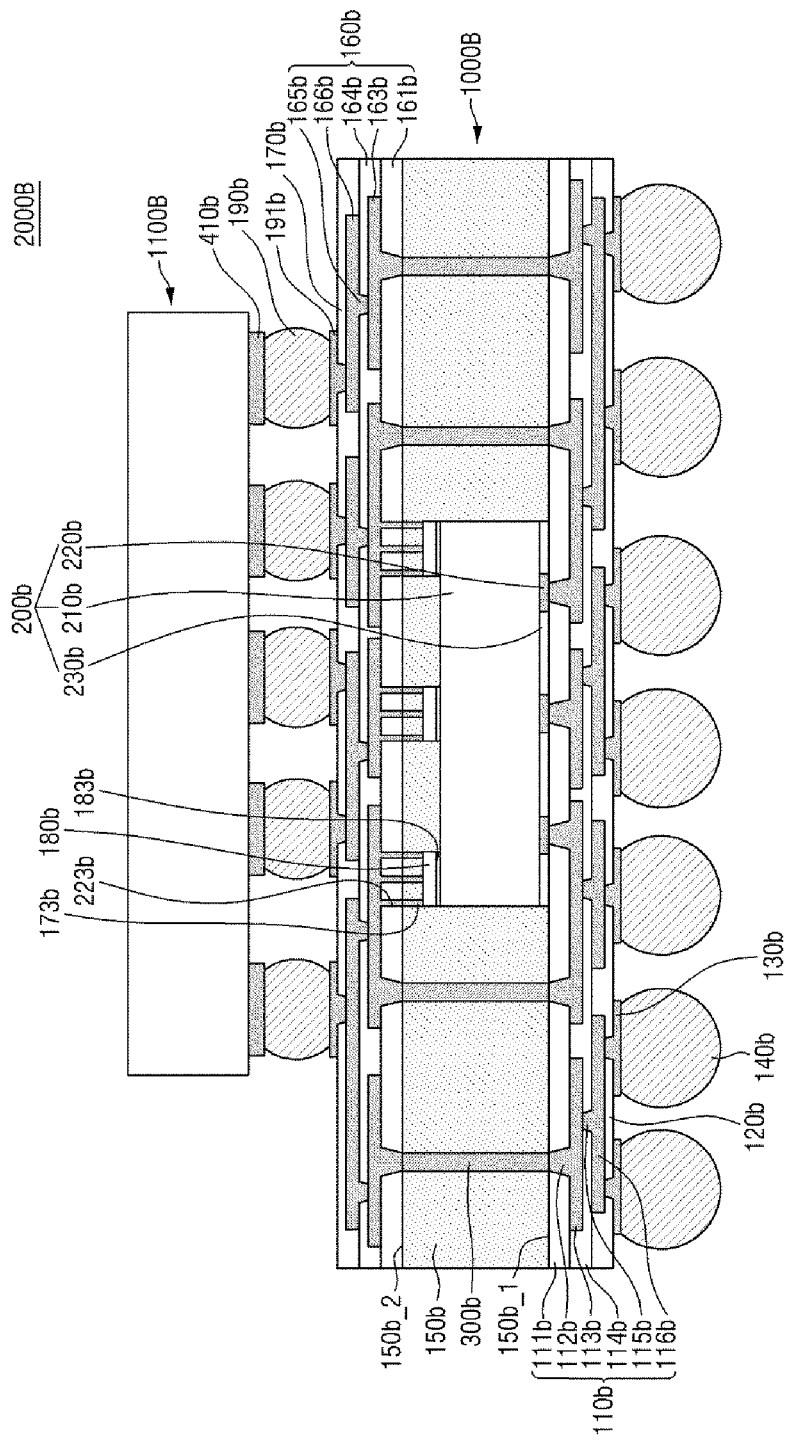

FIG. 19 is a cross-sectional view illustrating a semiconductor package 200B according to embodiments. Only material difference between the embodiment of FIG. 19 and previously described embodiments will be emphasized.

Referring to FIG. 19, the semiconductor package 2000B may include a first redistribution layer 110b, a first semiconductor chip 200b, third connection members 300b (e.g., through vias or vertical interconnectors), a passivation layer 120b, an under bump metal layer 130b, second connection terminals 140b, a third mold layer 150b (e.g., an encapsulant), a second redistribution layer 160b, a passivation layer 170b, an under bump metal layer 191b, and fourth connection members 190b.

The first semiconductor chip 200b may be disposed on the first redistribution layer 110b. For example, the first semiconductor chip 200b may be centrally disposed on the first redistribution layer 110b. The first semiconductor chip 200b may electrically be connected with the first redistribution layer 110b.

The first semiconductor chip 200b may include a body 210b, connection pads 220b, and a passivation film 230b. The connection pads 220b may variously connect the first semiconductor chip 200b with other element(s) (e.g., the first redistribution layer 110b). Each of connection pads 220b may include one or more conductive material(s). The passivation film 230b may selectively expose one or more of the connection pads 220b. Here, the passivation film 230b may include an oxide film and/or a nitride film.

The third connection members 300b may be disposed on the first redistribution layer 110b, and laterally spaced apart from the first semiconductor chip 200b. For example, one or more third connection members 300b may be disposed on the first redistribution layer 110b to substantially surround the first semiconductor chip 200b. The third connection members 300b may respectively contact and be electrically connected to the first redistribution layer 110b. Thus, the third connection members 300b and the first semiconductor chip 200b may electrically be connected through the first redistribution layer 110b.

The third mold layer 150b may be introduced to protect the first semiconductor chip 200b and the third connection members 300b. Thus, the third mold layer 150b may fill spaces between the third connection members 300, as well as a space between the third connection members 300b and the first semiconductor chip 200b.

In some embodiments, the third mold layer 150b may include a lower surface 150b_1 contacting the first redistribution layer 110b, and an upper surface 150b_2 contacting the second redistribution layer 160b.

The first redistribution layer 110b may effectively re-wire the connection pads 220b of the first semiconductor chip 200b. In this regard, the first redistribution layer 110b may be a front redistribution layer (FRDL). The connection pads 220b of the first semiconductor chip 200b may be re-wired through the first redistribution layer 110b. For example, the connection pads 220b may be mechanically and/or electrically connected to the second connection terminals 140b, the third connection members 300b and the fourth connection members 190b through the first redistribution layer 110b.

In the illustrated example of FIG. 19, the first redistribution layer 110b includes an insulating layer 111b, a via 112b, a line wiring 113b, an insulating layer 114b, a via 115b and a line wiring 116b.

The second redistribution layer 160b may be disposed on the third mold layer 150b. For example, the second redistribution layer 160b may be disposed on the upper surface 150b_2. In some embodiments, the second redistribution layer 160b may extend substantially across the first semiconductor chip 200b and/or the third connection members 300b.

In the illustrated example of FIG. 19, the second redistribution layer 160b includes an insulating layer 161b, a via 162b, a line wiring 163b, an insulating layer 164b, a via 165b, and a line wiring 166b.

The passivation layer 170b may be provided to protect the second redistribution layer 160b, and the passivation layer 170b may selectively expose portions of the line wiring 166b.

The under bump metal layer 191b may be provided to improve connection reliability of the fourth connection members 190b. Hence, the under bump metal layer 191b may be formed on portions of the passivation layer 170b to connect exposed portions of the line wiring 166b.

The fourth connection members 190b may mechanically and/or electrically connect a first semiconductor package 1000B with a second semiconductor package 1100B.

The first element 180b may be interposed between the first semiconductor chip 200b and the second redistribution layer 160b. The third mold layer 150b may contact the upper and side surfaces of the first element 180b.

That is, the first element 180b may be connected to the second redistribution layer 160b by a first connection pad 223b and a first connection wire 173b. The first element 180b is connected with the second redistribution layer 160b by the first connection pad 223b of the second redistribution layer 160b. The first connection wire 173b is disposed between the upper surface of the first element 180b and the second redistribution layer 160b.

The first element 180b may be used to provide power from the main board 30 (on which the first semiconductor package 1000B is mounted) to the second semiconductor package 1100B.

Although the certain embodiments have been described with reference to the accompanying drawings, it will be apparent to those skilled in the art that the present disclosure may be various modified without removing such modifications from the scope of the inventive concept, as defined by the following claims.

What is claimed is:

1. A semiconductor package comprising:
   a substrate including a first insulating layer and a first conductive pattern in the first insulating layer;
   a first semiconductor chip on the substrate;
   an interposer spaced apart from the first semiconductor chip in a direction perpendicular to an upper surface of the substrate, and including a second insulating layer and a second conductive pattern in the second insulating layer;
   a first element between the first semiconductor chip and the interposer, the first element comprising
   a first face fixed to an upper surface of the first semiconductor chip with a non-conductive adhesive layer between the first face and the upper surface of the first semiconductor chip, and
   a second face opposite the first face, the second face having contacts electrically connected to the interposer;
   a connection member between the substrate and the interposer; and
   a mold layer covering side surfaces of the first semiconductor chip and side surfaces of the first element.

2. The semiconductor package of claim 1, wherein the connection member has a height greater than a sum of a height of the first element and a height of the first semiconductor chip.

3. The semiconductor package of claim 1, further comprising:
   first bumps between a lower surface of the first semiconductor chip and the substrate; and
   a connection wire between the second face of the first element and the interposer.

4. The semiconductor package of claim 3,
   wherein the connection member has a height greater than a sum of a first height and a second height,
   wherein the first height is equal to a height of the first semiconductor chip and a height of the first bumps, and
   wherein the second height is equal to a height of the first element and a height of the connection wire.

5. The semiconductor package of claim 3, wherein the connection wire is formed by filling a trench with at least one conductive material.

6. The semiconductor package of claim 1, further comprising a second element laterally spaced apart from the first element in a direction parallel with the upper surface of the substrate.

7. The semiconductor package of claim 1, further comprising a second semiconductor chip spaced apart from the interposer in a direction perpendicular to the upper surface of the substrate.

8. The semiconductor package of claim 1,
   wherein the substrate includes an upper passivation film covering an upper surface of the first insulating layer and an upper pad selectively exposed through the upper passivation film,
   wherein the interposer includes a lower passivation film covering a lower surface of the second insulating layer and a lower pad selectively exposed through the lower passivation film, and
   wherein the connection member contacts the upper pad and the lower pad.

9. A semiconductor package comprising:
   a first semiconductor package; and
   a second semiconductor package on the first semiconductor package,
   wherein the first semiconductor package includes:
      a first substrate including a first insulating layer and a first conductive pattern in the first insulating layer;

a first semiconductor chip mounted on the first substrate;

a second substrate spaced apart from the first semiconductor chip in a direction perpendicular to an upper surface of the first substrate, and including a second insulating layer and a second conductive pattern in the second insulating layer;

and a first element between the first semiconductor chip and the second substrate, the first element comprising a first face fixed to an upper surface of the first semiconductor chip with a non-conductive adhesive layer between the first face and the upper surface of the first semiconductor chip, and a second face opposite the first face, the second face having contacts electrically connected to the second conductive pattern, wherein the second semiconductor package includes:

a third substrate on the first semiconductor package; and a second semiconductor chip mounted on the third substrate, and wherein the first element does not physically contact the second semiconductor package.

10. The semiconductor package of claim 9, further comprising a mold layer covering side surfaces of the first semiconductor chip and contacting the second face and side surfaces of the first element.

11. The semiconductor package of claim 9, further comprising:

a first connection member interposed between the first substrate and the second substrate and electrically connecting the first conductive pattern to the second conductive pattern; and a second connection member interposed between the second substrate and the third substrate and electrically connecting the first semiconductor package to the second semiconductor package.

12. The semiconductor package of claim 11, wherein the first connection member has a height greater than a sum of a height of the first element and a height of the first semiconductor chip.

13. The semiconductor package of claim 9, further comprising a second element laterally spaced apart from the first element in a direction parallel with the upper surface of the first substrate.

14. The semiconductor package of claim 9, further comprising:

a connection wire between the second face of the first element and the second substrate; and a connection pad disposed in the second substrate to contact the connection wire, wherein the connection wire is formed by filling a trench with at least one conductive material.

15. A method of fabricating a semiconductor package, the method comprising:

providing a first substrate including a first insulating layer and a first conductive pattern;

forming a passive element on one surface of the first substrate;

providing a second substrate mounting a first semiconductor chip and including a second insulating layer and a second conductive pattern;

forming a connection member between the first substrate and the second substrate; and forming a mold layer covering side surfaces of the connection member, covering side surfaces of the first semiconductor chip, and contacting side surfaces of the passive element, wherein the passive element comprises a first face between the side surfaces of the passive element, the first face being fixed to an upper surface of the first semiconductor chip with a non-conductive adhesive layer between the first face and the upper surface of the first semiconductor chip, and a second face opposite the first face, the second face having contacts electrically connected to the first conductive pattern.

16. The method of claim 15, wherein the connection member has a height greater than a sum of a height of the passive element and a height of the first semiconductor chip.

17. The method of claim 15, further comprising:

introducing an underfill material between the first substrate and the second face of the passive element.

18. The method of claim 15, further comprising:

providing a third substrate mounting a second semiconductor chip; and disposing the third substrate on the first substrate, wherein the third substrate is spaced apart from the first semiconductor chip in a direction perpendicular to an upper surface of the first substrate.

* * * * *